(12) United States Patent
Hanawa et al.

(10) Patent No.: US 7,804,176 B2
(45) Date of Patent: Sep. 28, 2010

(54) SEMICONDUCTOR DEVICE

(75) Inventors: Kazuko Hanawa, Tokyo (JP); Takashi Kikuchi, Tokyo (JP); Koichi Kanemoto, Tokyo (JP); Michiaki Sugiyama, Tokyo (JP); Chikako Imura, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 11/626,286

(22) Filed: Jan. 23, 2007

(65) Prior Publication Data

US 2007/0194454 A1  Aug. 23, 2007

(30) Foreign Application Priority Data

Feb. 22, 2006 (JP) .............................. 2006-045463

(51) Int. Cl.
  *H01L 23/48* (2006.01)
  *H01L 23/52* (2006.01)
  *H01L 29/40* (2006.01)
(52) U.S. Cl. ..................... 257/777; 257/685; 257/686; 257/778; 257/E21.111; 257/E23.01; 438/109; 438/617
(58) Field of Classification Search ................ 257/777, 257/685, 686, 778, 782, 784, E21.111, E23.01; 438/109, 617
See application file for complete search history.

(56) References Cited

U.S. PATENT DOCUMENTS 6,538,331 B2  3/2003  Masuda et al.

FOREIGN PATENT DOCUMENTS

| JP | 2001-102515 | | 4/2001 |
|---|---|---|---|
| JP | 2001102515 | * | 4/2001 |
| JP | 2001-217383 | * | 8/2001 |

* cited by examiner

*Primary Examiner*—Cuong Q Nguyen
*Assistant Examiner*—Cathy N Lam
(74) *Attorney, Agent, or Firm*—Mattingly & Malur, P.C.

(57) ABSTRACT

This invention is to provide a nonvolatile memory device that enhances a size reduction and mass productivity while ensuring reliability and signal transmission performance. A nonvolatile memory chip having a first side formed with no pads and a second side formed with pads is mounted on a mounting substrate. A control chip for controlling the nonvolatile memory chip is mounted on the nonvolatile memory chip. The control chip has a first pad row corresponding to the pads of the nonvolatile memory chip. The first pad row is mounted adjacent to the first side of the nonvolatile memory chip. The first pad row of the control chip and a first electrode row formed on the mounting substrate are connected via a first wire group. The pads of the nonvolatile memory chip and a second electrode row formed on the mounting substrate are connected via a second wire group. The first electrode row and the second electrode row are connected through wirings formed in the mounting substrate.

8 Claims, 9 Drawing Sheets

PRIOR ART *FIG. 13*
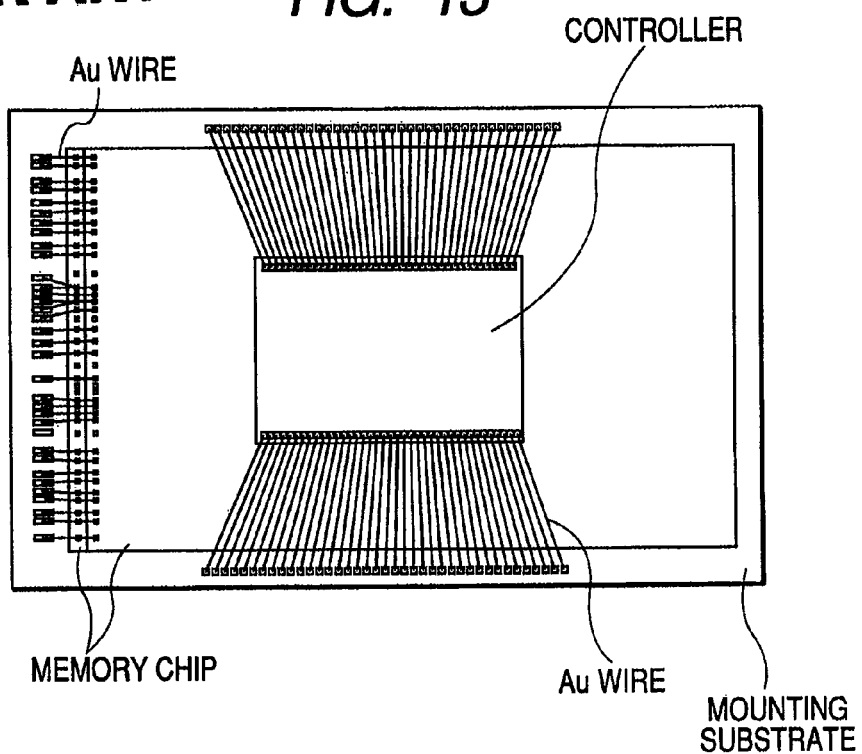
PRIOR ART *FIG. 14*
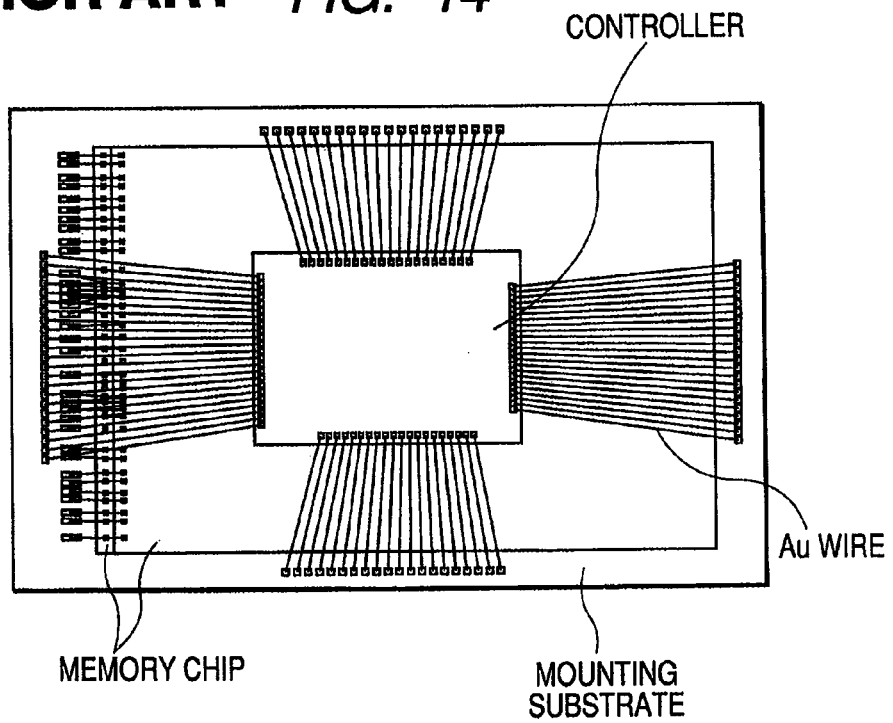

SEMICONDUCTOR DEVICE

CROSS-REFERENCE TO RELATED APPLICATION

The present application claims priority from Japanese patent application No. 2006-45463 filed on Feb. 22, 2006, the content of which is hereby incorporated by reference into this application.

BACKGROUND OF THE INVENTION

The present invention relates to a nonvolatile memory device, and to a technique effective if applied to a nonvolatile memory device of a multichip package (MCP) structure comprising, for example, a flash memory chip and a controller chip.

As examples each illustrative of a semiconductor device in which a plurality of semiconductor chips are laminated and sealed with a resin, there have been known those disclosed in Japanese Unexamined Patent Publication No. 2001-102515 (patent document 1) and Japanese Unexamined Patent Publication No. 2001-217383 (patent document 2). Japanese Unexamined Patent Publication No. 2001-102515 is directed to the invention wherein two semiconductor chips identical in size and bonding pads are laminated two or more and wire-bonded between the same and electrodes of a substrate. The present configuration has the problem that wires overlap each other as viewed from above to make it difficult to judge the presence or absence of shorts between the upper and lower wires in a visual inspective process or make it easy to develop a short circuit therebetween. In order to avoid it, the two chips are laid out with being shifted. In the invention of Japanese Unexamined Patent Publication No. 2001-217383, pads of an upper layer chip are provided on one side thereof or adjoining two sides thereof in integrated form to prevent a short circuit between adjoining wires in the upper layer chip, a short circuit with respect to a lower layer chip due to dangling, or a wire break or the like. In the upper layer chip, the corner comprising the one side or two sides such that the length of each of the wires becomes shorter is set so as to adjoin one side or the corner where corresponding pads of a lower layer chip are provided.

SUMMARY OF THE INVENTION

The applicant of the present application has developed a nonvolatile memory (Super AND flash memory) wherein a sector management function for guaranteeing a 100% non-conductive-item sector, an ECC (error detection/correction) circuit, and a controller (memory management circuit) section like an automatic ware leveling circuit for leveling the number of rewritings of each memory cell are mounted in a flash memory to improve the ease-of-use thereof.

A memory section of the nonvolatile memory is of a stacked gate structure in which each memory cell is constituted of a control gate and a floating gate. The memory section is formed in a special process directed to each memory cell like an AG (Assist-Gate)-AND cell structure. On the other hand, since the controller section simply performs signal processing, a general CMOS circuit can be formed. From another point of view, the memory section needs to make use of a most-advanced semiconductor technique with the aim of providing a mass storage capacity, whereas the controller section can be manufactured without any hindrance even in the case of a so-called previous generation semiconductor technique.

The applicant of the present application has realized or noted that the memory section and controller section formed in the processes different as described above are formed on one semiconductor substrate as in the nonvolatile memory to thereby separate the memory section and the controller section from each other to form them in discrete chips, and they are brought into one semiconductor device by a stacked-structure type multichip package (MCP) technique, whereby a lot of advantages are brought about.

For example, (1) since the semiconductor chip of the memory section can be reduced in chip size by a proportion corresponding to the elimination of the controller section, a semiconductor device assembled by the MCP (Multichip Package) can be made small-sized. (2) A reduction in the size of a memory chip due to its shrinkage can easily be achieved by eliminating each of controller sections different in the degree of progress of shrinkage. Further, since the controller section is originally small in circuit scale, the significance of the reduction in chip size due to the shrinkage is small. (3) High performance elements can be stably formed without causing waste and an unreasonable demand in manufacturing process since two semiconductor chips are respectively formed in the optimum manufacturing process. (4) Simply enabling combinations of the controller section with a plurality of the memory chips makes it possible to enhance chip mass productivity by commonality of semiconductor chips to be used, even with respect to the development of kinds corresponding to a plurality of types of memory capacities. Since those originally formed on one semiconductor substrate are separated from each other and formed and assembled in discrete chips while such an advantage is obtained, a deterioration in the reliability and signal transmission performance at a portion where they are connected to each other is predicted.

An object of the present invention is to provide a nonvolatile memory device that enhances a size reduction and mass productivity while ensuring reliability and signal transmission performance. The above, other objects and novel features of the present invention will become apparent from the description of the present specification and the accompanying drawings.

A summary of a representative one of the inventions disclosed in the present application will briefly be explained as follows: A nonvolatile memory chip having a first side unformed with bonding pads is mounted over a mounting substrate. A control chip having a second side provided with a first bonding pad row interposed between external terminals and the nonvolatile memory chip and corresponding to the external terminals and the nonvolatile memory chip and with a first bonding wire group connected thereto is mounted over the nonvolatile memory chip. The second side of the control chip is caused to adjoin the first side of the nonvolatile memory chip. The first bonding wire group connects between the first bonding pad row and a first electrode row formed in the mounting substrate respectively. The first electrode row and a second electrode row formed corresponding to the external terminals and the nonvolatile memory chip are connected by wires formed in the mounting substrate.

It is possible to enhance a size reduction and mass productivity while reliability and signal transmission performance are being ensured.

BRIEF DESCRIPTION OF THE DRAWINGS

FIG. 13 is a plan view showing a nonvolatile memory layer of an MCP configuration discussed prior to the invention of the present application;

FIG. 14 is a plan view illustrating a nonvolatile memory layer of an MCP configuration discussed prior to the invention of the present application.

DETAILED DESCRIPTION OF THE PREFERRED EMBODIMENTS

Figure 1:
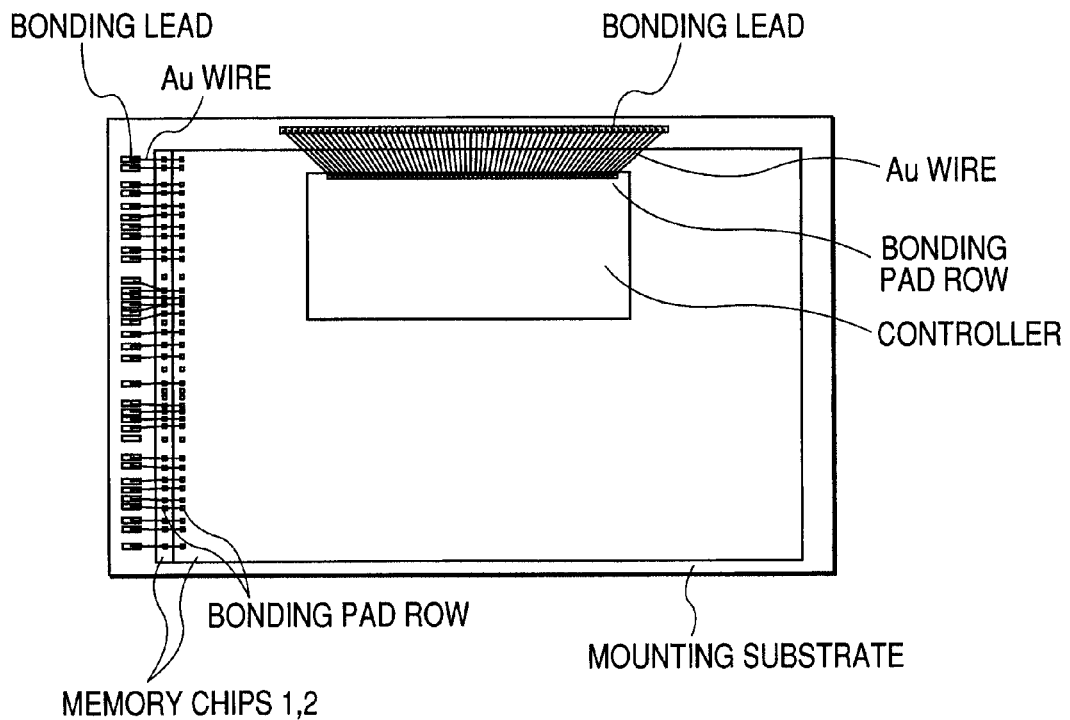
FIG. 1 is a plan view showing one embodiment of a nonvolatile memory device according to the present invention.
Figure 2:
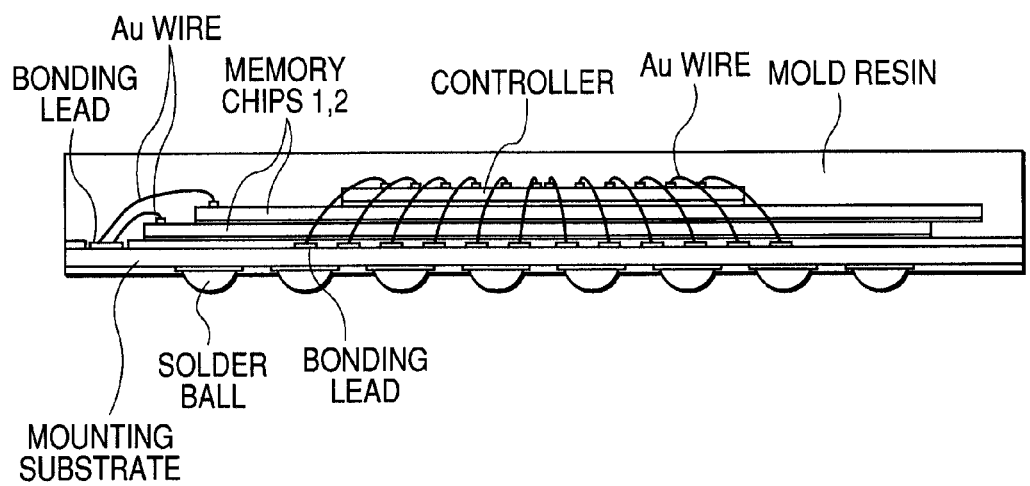
FIG. 2 is a schematic section of the nonvolatile memory device shown in FIG. 1.

FIG. 1 shows a plan view of one embodiment of an MCP (SiP) as a nonvolatile memory device according to the present invention. FIG. 2 shows a schematic section thereof. In FIGS. 1 and 2, the MCP according to the present embodiment includes, although not restricted in particular, flash type two nonvolatile memories (hereinafter called simply memory chips 1 and 2) having a large storage capacity like an AG-AND type, and a controller including a CPU (Central Processing Unit) and a buffer memory, which are configured on a mounting substrate in the form of a layered structure.

Although not restricted in particular in the two memory chips 1 and 2, bonding pad rows are disposed along one short side of four sides. According to the relationship with the mounting substrate, the sides of the memory chips in which such bonding pad rows are disposed, are disposed in such a manner that the bonding pad rows correspond to bonding leads (electrode row) disposed along the left side of the mounting substrate as shown in FIG. 1. In this case, the memory chip 2 on the upper side is disposed with being shifted to the right side so as not to overlap with the bonding pad row of the memory chip 1 on the lower side. That is, the bonding pad rows of the two memory chips 1 and 2 are provided so as to be aligned on the plan view.

Even in the case of the controller mounted on the memory chips, a bonding pad row is disposed along one long side of four sides in a manner similar to the above. The controller is disposed in such a manner that the bonding pad row is rotated 90° with respect to the bonding pad rows of the memory chips 1 and 2 and associated with bonding leads disposed along the upper side of the mounting substrate. Since no bonding pad row is disposed on the upper sides of the memory chips extending along the upper side of the mounting substrate, the side on which the bonding pad row of the controller is disposed, is disposed with being biased toward the upper side of the memory chip 2 in such a manner that the distance to each of the bonding leads (electrodes) disposed along the upper side of the mounting substrate reaches a distance which is the shortest and at which mass productivity has been taken into consideration. That is, the length of the wire for connecting each pad of a controller chip and each electrode of the mounting substrate is such a length as to be capable of preventing a short circuit in each memory chip located below the wires and is set to such a short length that inductance can be reduced as much as possible.

As shown in FIG. 2, the bonding pad rows of the memory chips 1 and 2 and the bonding leads of the mounting substrate are bonded by Au (gold) wires respectively. Since, in this case, bonding pads each having the same function, of the memory chips 1 and 2 are connected to the same bonding leads of the mounting substrate for the most part, no substantial problem occurs even though the upper and lower wires overlap one another and make contact with one another. The boding pad row of the controller and the corresponding bonding leads of the mounting substrate are bonded by Au (gold) wires in like manner.

The memory chip 1 is adhered onto the surface of the mounting substrate using a thermosetting adhesive or a die bond film provided on its back surface. Likewise, the memory chip 2 is adhered onto the surface of the memory chip 1 using a thermosetting adhesive or a die bond film provided on its back surface. And the controller is also adhered to the surface of the memory chip 2 using a thermosetting adhesive or a die bond film provided on its back surface in like manner. The three silicon chips are brought into a layered or laminated structure in this way. The memory chips 1 and 2 and the controller, and the bonding wires provided thereat are sealed with a mold resin used as a resin-molded body. A reflow with balls used as external terminals is effected on the back surface side of the mounting substrate to form an MCP.

The mounting substrate includes an insulated board made up of, for example, glass epoxy or glass, relatively microfabricated internal wirings or interconnections constituted of a multilayered wiring construction formed on the insulated board, and a plurality of external terminals. In the mounting substrate, the bonding leads for wire-connecting to the bonding pads respectively provided in the memory chips 1 and 2 and the controller are formed on its main surface. The bonding leads connect the memory chips 1 and 2 and the controller through the internal wirings.

Figure 3:
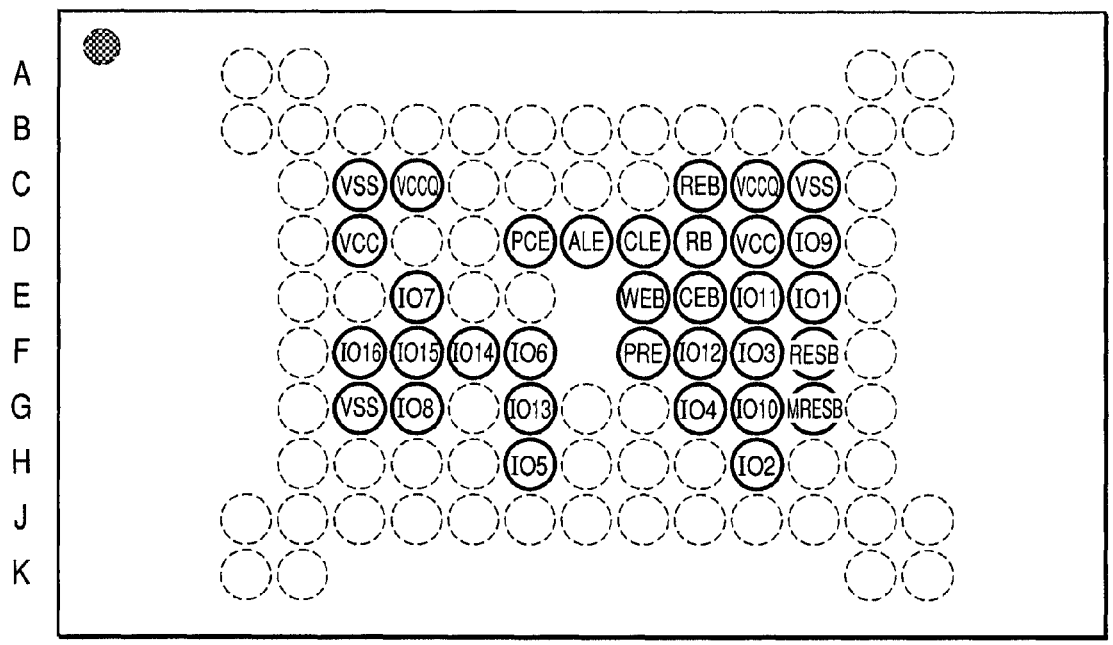
FIG. 3 is a plan view illustrating another embodiment of a nonvolatile memory device according to the present invention.

A back view of one embodiment of the MCP is shown in FIG. 3. Although not restricted in particular, the BGA package according to the present embodiment is configured as a 98-ball CSP (TBP-98V) type, and solder balls with no terminal names are configured as empty or free terminals. The 46 balls (terminals) of the 96 balls (terminals) are configured as the empty terminals.

Figure 4:
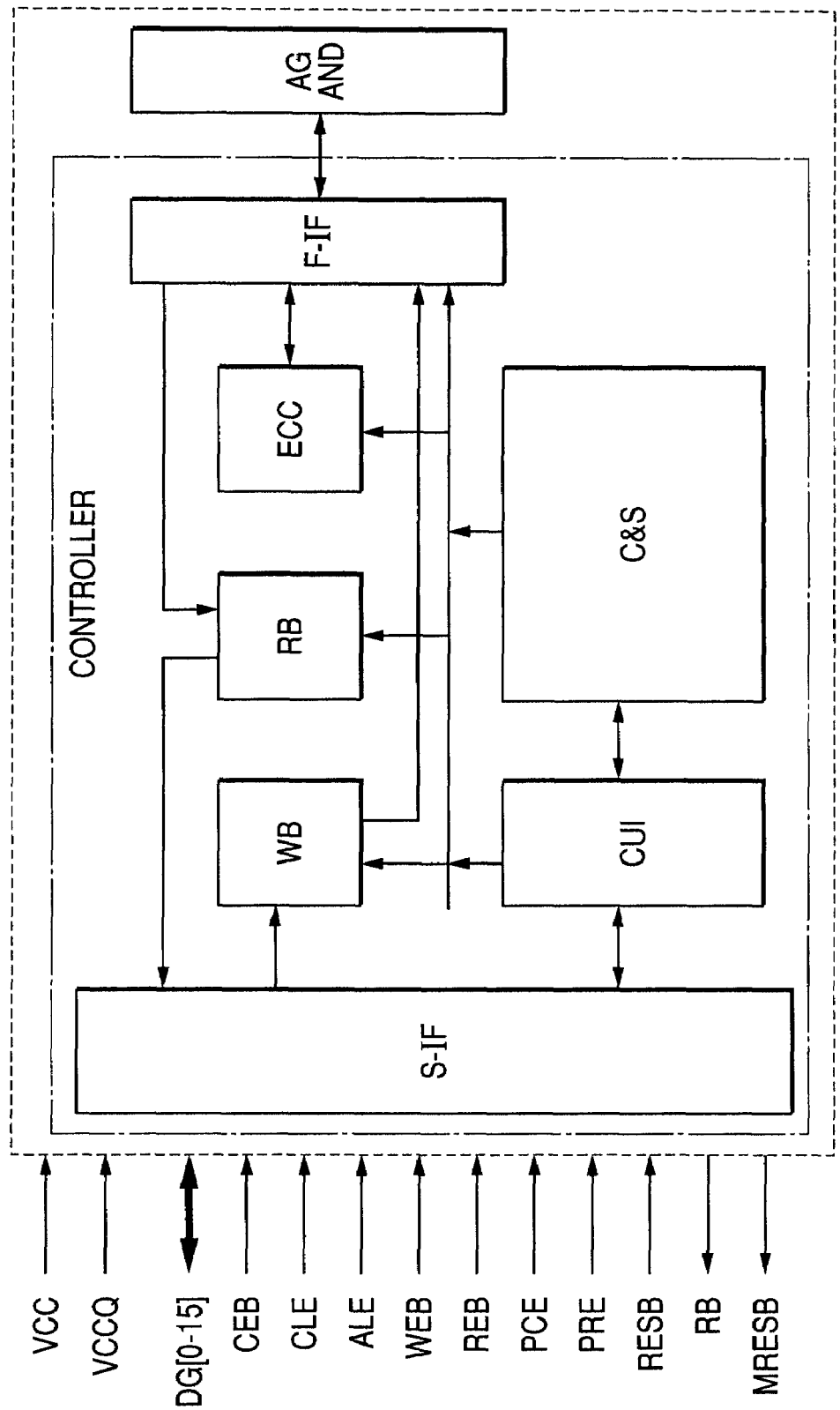
FIG. 4 is a schematic section of the nonvolatile memory device shown in FIG. 3.

A block diagram of one embodiment of the nonvolatile memory device according to the present invention is shown in FIG. 4. In the same figure, a portion surrounded by a dotted line constitutes the nonvolatile memory device. Such a controller as indicated by a one-dot chain line, and the AG-AND indicated by a solid line are provided thereinside. The controller and the memory chip AG-AND are respectively constituted of one silicon chip. As will be described later, although not restricted in particular, one controller is capable of controlling two memory chips AG-ANDs at the maximum.

The controller takes charge of a defect block management and a complex memory management such as an error correction executed by a host or the like upon use of the conventional flash memory, with being interposed between an external host and the memory chip AG-AND. In order to suppress the concentration of rewriting for a predetermined area, a number-of-rewritings equalizing or leveling processing function for rewriting a block address of the memory chip AG-AND for each given predetermined number of rewritings, an auto read function which makes it possible to read data without inputting addresses or commands, or a data protection function is provided.

In order to make faster writing, reading or rewriting from the host side, the nonvolatile memory device includes a write buffer WB constituted of an SRAM (Static Random Access Memory) or the like, a read buffer RB, an error detection/correction circuit ECC, a controller, a status C&S, and a processor CUI. Further, it is equipped with an interface S-IF on the system side and an interface F-IF on the memory side. The writing from the host side is carried out at high speed in accordance with the writing for the write buffer WB. Thereafter, the controller writes data written into the write buffer WB into the memory chip AG-AND in accordance with the defect block management and the number-of-rewritings leveling processing function. As to the reading into the host side, the data is read from the memory chip AG-AND in accordance with a command and an address and subjected to error detection/correction by the ECC, followed by being stored in the read buffer RB. Then, the data stored in the read buffer RB is outputted to the host side at high speed. Although not restricted in particular, the error detection/correction circuit ECC has a 4-byte error correcting and 4-byte error detecting function per page (512 bytes).

The nonvolatile memory device according to the present embodiment has the following external terminals corresponding to the interface S-IF. These external terminals are associated with the solder balls provided on the back surface of FIG. 3. The last character B indicate a bar signal and means that a low level is brought to an active level. VCC indicates a power supply voltage for each internal circuit, and VCCQ indicates a power supply voltage for an output circuit, respectively. GND indicates ground. DQ (0-15) indicate data input/output terminals. In an 8-bit product, 8-15 are provided as empty or free terminals. In FIG. 3, they are represented like IO0 through IO15. These terminals DQ (0-15) are used for input/output of commands, addresses and data. The terminals DQ (0-15) indicate tri-state pins. When the terminals are invalidated by CEB and REB, they are transitioned to a high impedance state. As described above, DQ (8-15) are disposed only in the case of ×16-bit product and used for data delivery.

CEB indicates a chip enable terminal, which selects a device in accordance with a low level and brings the same to an active state. When the terminal CEB is rendered high in level, the device reaches a standby state. Even though it is brought to the high level during command execution of erase, program and rewrite, the command execution is continued. REB indicates a read enable terminal, where the output of data is started at the edge falling into the low level. The output of data is ended at the edge rising to the high level. Upon serial read, a column address is incremented by (+1). WEB indicates a write enable signal, where a command, an address and data are fetched into the device on the rising edge from the low to high levels.

CLE indicates a command latch enable terminal, which is a terminal for designating data on a DQ bus as a command. When the CLE terminal is in a high level state, the data on the DQ bus is fetched in on the rising edge at the terminal WEB and recognized as command data. ALE indicates an address latch enable terminal, which is a terminal for designating data on the DQ bus as an address. When the ALE terminal is in a high level state, the data on the DQ bus is taken in on the rising edge at the terminal WEB and recognized as address data. PCE indicates a protect control enable terminal, which makes it possible to control a data protection function by setting the same to a high level. RB indicates a ready/busy terminal, which is an output terminal indicating a ready (Ready)/busy (Busy) state of the device. Since the terminal RB is of an open drain terminal, there is a need to pull up the same to the VCC side by resistance upon its use. When the terminal RB is low in level, it indicates that the device is a busy state, whereas when the terminal RB is high in level, it indicates that the device is a ready state.

PRE indicates a power-on auto read enable terminal, which brings a high level to an active level and sets an auto read function. When the auto read function is not used, the PRE is set to a low level. MRESB indicates a master reset output terminal, which is used as for a reset signal to the CPU and controller upon usage of the auto read function. The MRESB indicates that the output of data is made possible by switching the terminal MRESB from a low level to a high level. When the auto read function is not used, the MRESB indicates that the internal initialization of the device has been completed by switching the MRESB from the low to high levels. RESB indicates a reset terminal. It is necessary to set the terminal RESB to a low level at power-on. After power-on, the terminal RESB is transitioned from the low to high levels to initialize the device. When the terminal RESB is brought to the low level during a waiting for a command or in a standby state, the device is transitioned to a reset state. When the terminal RESB is thereafter rendered high in level, the device is initialized and returned from the reset state. When the terminal is rendered low in level during command execution, the command execution is forcedly terminated and hence the device is brought to a hard reset state.

The memory chip AG-AND is configured so as to have a storage capacity like 8G bits by a combination of two memory chips. The data protection function is a so-called user ROM function and locks the memory chip AG-AND to set an area unrewritable subsequently. The present area is set in 64M-bit (256-block) units from a low-order address, for example. Once the memory chip is locked, its state is held until its lock is released. Since the locked area is physically separated from other areas, data in the locked area is protected even when other areas are brought to an abnormal state by abnormal processing. The locked area becomes short in initialization time after the release of reset. That is, there is a need to initialize a data area in order to obtain access to an unlocked area. Locking data necessary upon system startup using the present function makes it possible to protect the data and start up the system at high speed. When the present function is set, 64-M bits of the total memory capacity of 8-G bits are reduced.

A data area lock function is the function of protecting data unprotected by the user ROM function. In an initialization state after power-on and the release of reset, all areas are brought into a lock state. Designating an area and bringing it to an unlock state enables rewriting into the area. When the area is set to the lock state again, all the areas are brought to the lock state. Since the controller takes charge of the above memory management function, the nonvolatile memory device leads to a more-usable memory equal to or better than HDD in terms of performance in the system equipped with the nonvolatile memory device according to the present embodiment.

The memory chip AG-AND is a flash memory that performs a write operation using hot electrons to shorten a write time or the like. A memory cell thereof is provided with a third gate electrode (AG) for controlling a write current flowing between the drain and source thereof in addition to a floating gate and a control gate for holding the information charge. By controlling a voltage AG supplied to the third gate electrode, the drain-to-source current is set and the amount of writing is controlled. The present memory chip is not limited to it. The memory chip may be a flash type nonvolatile memory that performs writing and erasure by an F-N tunnel current. Any of the chips is operated as such a multivalued memory that memory information of 2 bits is stored in one memory cell to obtain a mass storage capacity.

In the present configuration, the memory section and the controller section formed in the processes different as described above are respectively formed by discrete chips. They are brought into one semiconductor device by a laminated-structure type multichip package (MCP) technique. Thus, as described above, (1) the semiconductor device assembled by the MCP can be made small-sized because the semiconductor chip of the memory section can be reduced in chip size by a proportion corresponding to the elimination of the controller section. (2) A reduction in the size of a memory chip due to its shrinkage can easily be achieved by eliminating each of controller sections different in the degree of progress of shrinkage. Further, since the controller section is originally small in circuit scale, the significance of the reduction in chip size due to the shrinkage is small. (3) High performance elements can be stably formed without causing waste and an unreasonable demand in manufacturing process since two semiconductor chips are respectively formed in the optimum manufacturing process. (4) Simply enabling combinations of each controller section with a plurality of the memory chips makes it possible to enhance chip mass productivity by commonality of semiconductor chips to be used, even with respect to the development of kinds corresponding to a plurality of types of memory capacities.

In order to take these advantages effectively, the controller is shaped in the form of a rectangle as shown in FIG. 1. A bonding pad row is concentratedly disposed on one long side. In the memory chip AG-AND, the bonding pad row of the controller is disposed along one side on which no bonding pad row is formed. The distance to each of the bonding leads (electrodes) of the mounting substrate is set so as to become the shortest. As a result, the length of each Au wire can be made short, so that the performance of transmission of a signal between each external terminal and the interface S-IF can be enhanced, and writing/reading through the intervention of the controller can be carried out at high speed in sync with a clock like, for example, 40 MHz. On the other hand, the transfer of each signal between the controller and its corresponding memory chip is enough even at a low frequency speed of 10 MHz or so. Thus, since the bonding pad row of each memory chip and the bonding pad row of the controller are placed in the positional or physical relationship in which they are rotated 90° on the mounting substrate as described above, a minor increase in the length of each internal wiring formed in the mounting substrate, for connecting them substantially presents no problem even though such a minor increase occurs.

Figure 15:
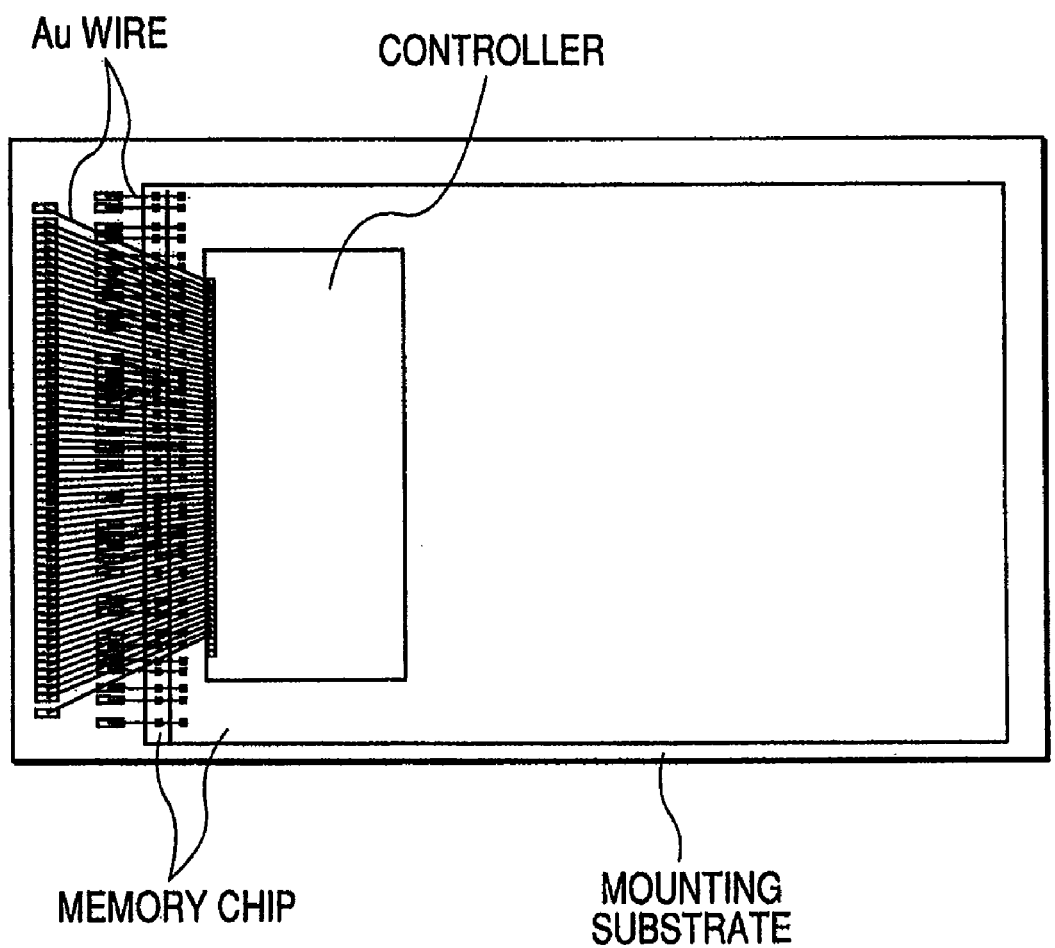
FIG. 15 is a plan view depicting a nonvolatile memory layer of an MCP configuration discussed prior to the invention of the present application.

Incidentally, FIGS. 13 through 15 are plan views showing nonvolatile memory layers discussed prior to the invention of the present application. When bonding pad rows are disposed on both sides of a controller chip as shown in FIG. 13, the controller chip must be placed in the center of each memory chip. Since the controller chip is smaller than each memory chip in size, the length of each of Au wires must be made longer. Therefore, both a delay in signal between the system requiring the high-speed operation and the controller, and a parasitic inductance component of each Au wire at the output of data increase. When a change in output signal is made faster, noise increases. As a result, a satisfactory signal transmission speed cannot be desired.

There is also a problem in that when bonding pad rows are disposed on four sides of a controller chip as shown in FIG. 14, Au wires further increase in length and the Au wires overlap with Au wires of each memory chip. Although there is an advantage that when a bonding pad row of a controller is disposed along bonding pad rows of memory chips, wirings between each memory chip and the controller can be made shortest, the length of each of Au wires between the controller and external-terminal bonding leads becomes longer even if the bonding pad row is caused to concentrate on one long side of the controller as shown in FIG. 15. According to this configuration, the speed of transmission of each signal between the controller and its corresponding system is impaired, and a harmful effect made due to an increase in the Au wire of the controller is rather great although each wiring for a printed circuit board between the controller and the memory chip becomes shorter. Accordingly, the configuration of FIG. 1 has a merit greater than that of each of the configurations shown FIGS. 13 through 15.

Figure 5:
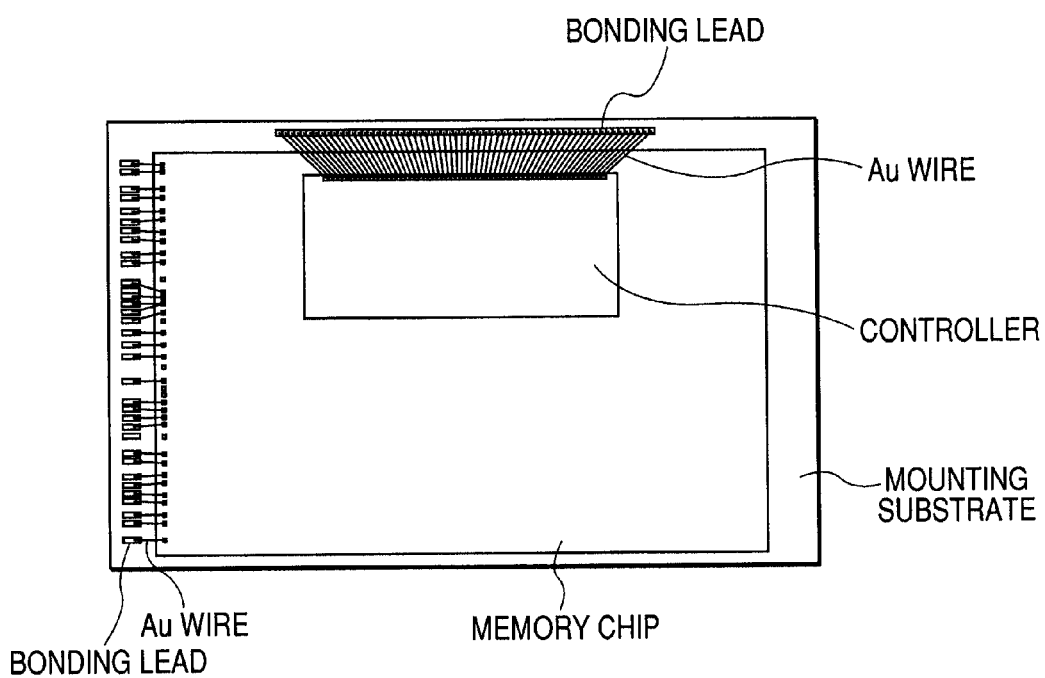
FIG. 5 is a plan view showing a further embodiment of a nonvolatile memory device according to the present invention.
Figure 6:
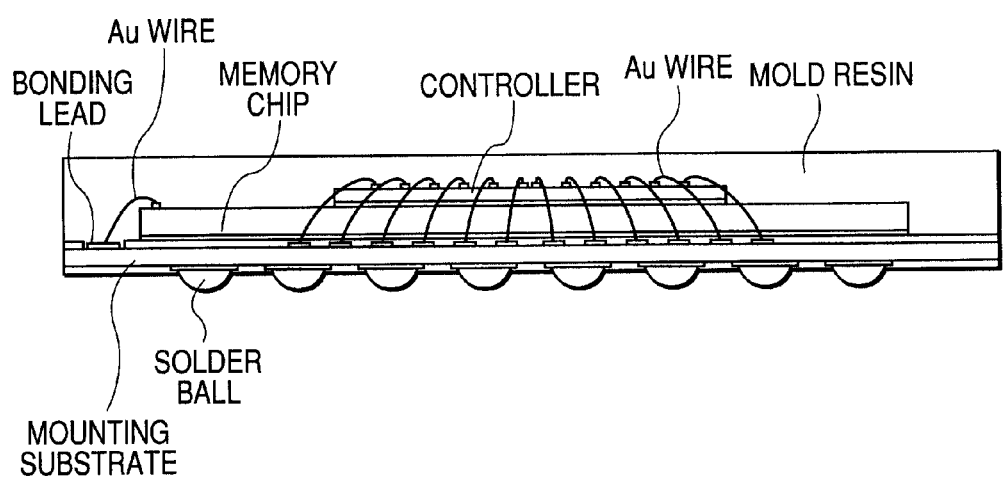
FIG. 6 is a schematic section of the nonvolatile memory device shown in FIG. 5.

A plan view of a further embodiment of an MCP (SiP) shown as a nonvolatile memory device according to the present invention is shown in FIG. 5. A schematic section thereof is shown in FIG. 6. In FIGS. 5 and 6, the MCP according to the present embodiment includes, although not restricted in particular, one flash type nonvolatile memory having a large storage capacity like an AG-AND type, and a controller including a CPU (Central Processing Unit) and a buffer memory, which are configured on a mounting substrate in the form of a layered structure. In this case, the MCP shown in FIG. 5 is reduced to half in storage capacity as compared with one shown in FIGS. 1 and 2. That is, the MCP can be realized by simply changing the number of memory chips in which product developments of two types corresponding to 8-G bits and 4-G bits are combined with the same controller.

Figure 7:
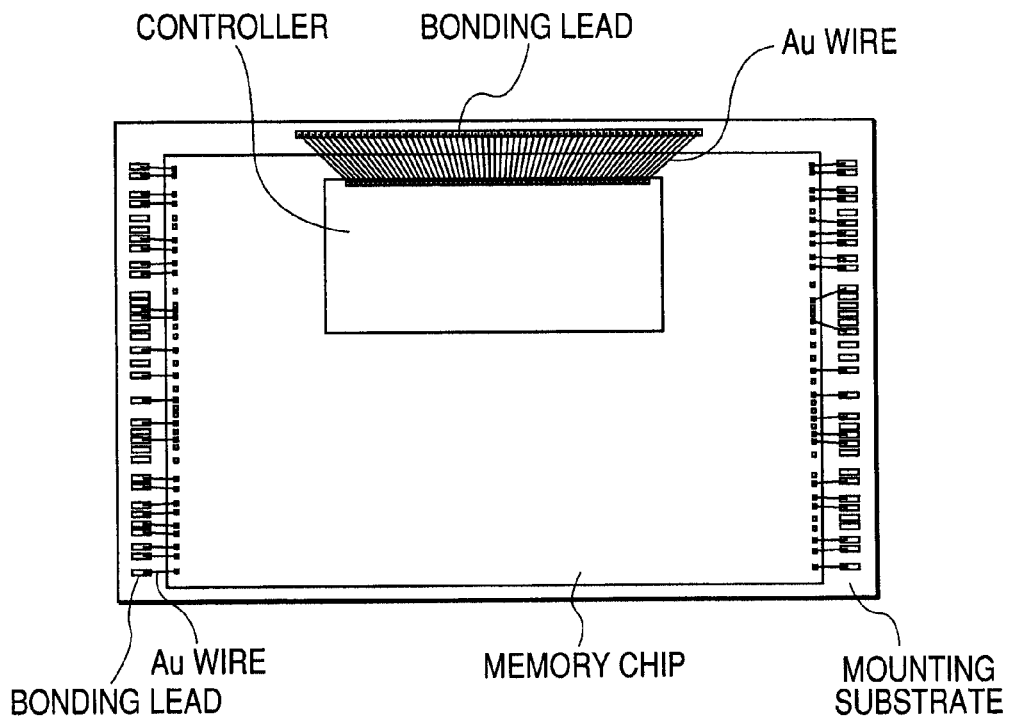
FIG. 7 is a plan view showing a still further embodiment of a nonvolatile memory device according to the present invention.
Figure 8:
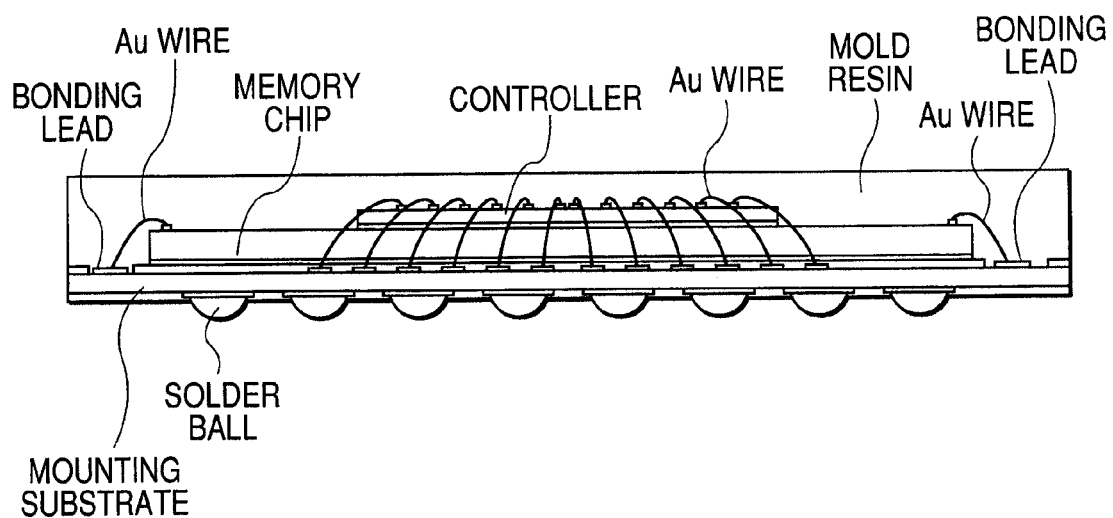
FIG. 8 is a schematic section of the nonvolatile memory device shown in FIG. 7.

A plan view of a still further embodiment of an MCP (SiP) shown as a nonvolatile memory device according to the present invention is shown in FIG. 7. A schematic section thereof is shown in FIG. 8. In FIGS. 7 and 8, the MCP according to the present embodiment includes one flash type nonvolatile memory having a large storage capacity, and a controller including a CPU (Central Processing Unit) and a buffer memory, which are configured on a mounting substrate in the form of a layered structure. In the present embodiment, bonding pad rows are disposed on two short sides in dispersed form within a memory chip. In one having address terminals, command terminals and the like as the memory chip, the number of bonding pads increases correspondingly. Therefore, it is effective to lay out the bonding pad rows on the two short sides in discrete form as in the present embodiment. A controller similar to the above can be used even for such a memory chip.

Figure 9:
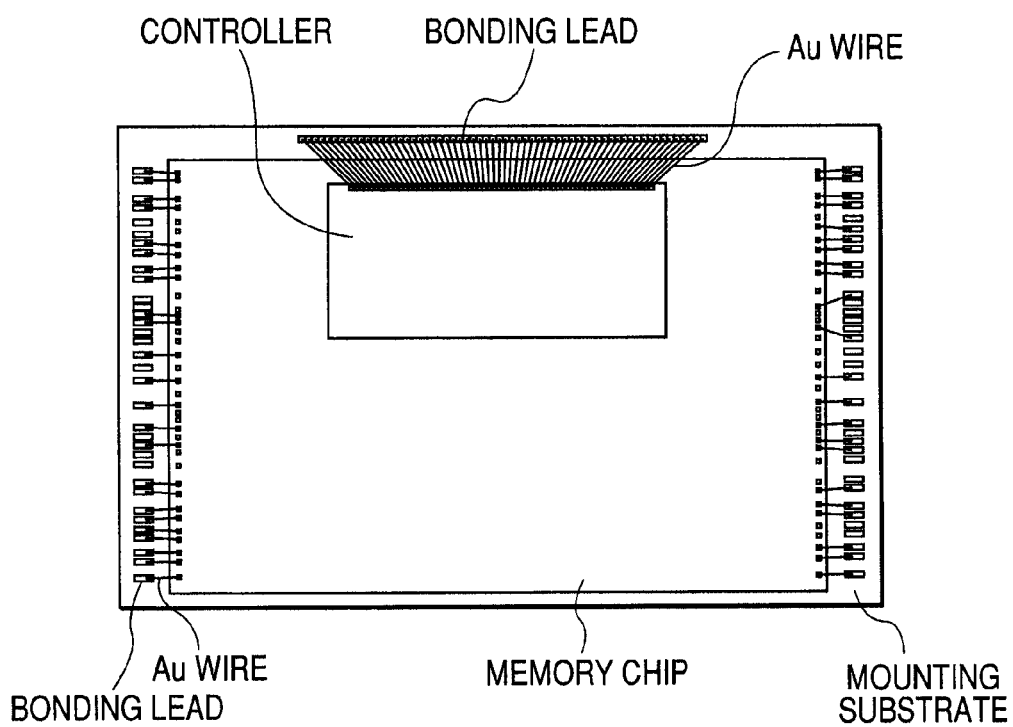
FIG. 9 is a plan view showing a still further embodiment of a nonvolatile memory device according to the present invention.
Figure 10:
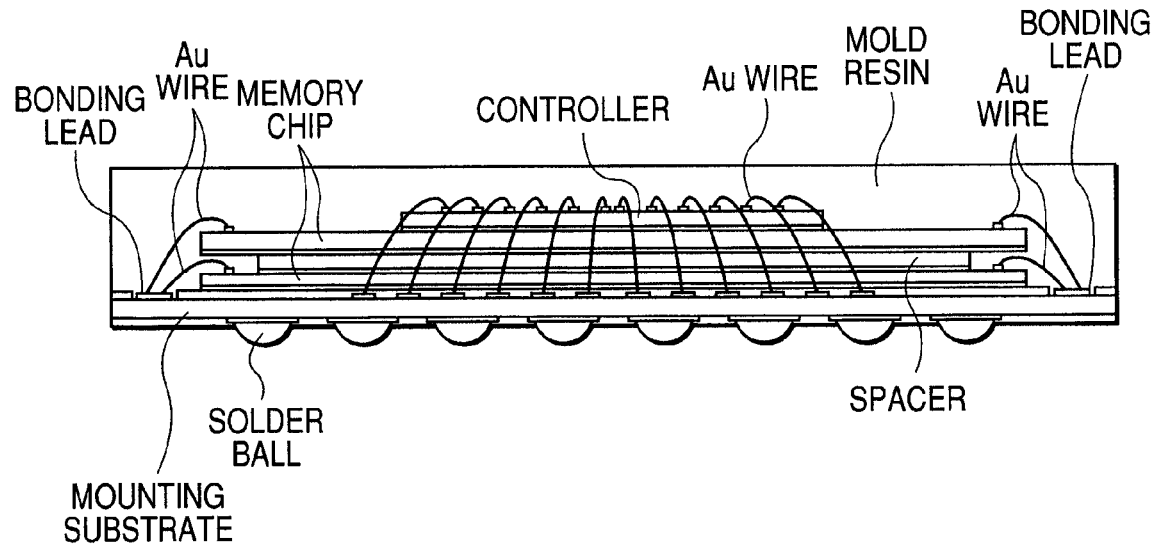
FIG. 10 is a schematic section of the nonvolatile memory device shown in FIG. 9.

A plan view showing a still further embodiment of an MCP (SiP) shown as a nonvolatile memory device according to the present invention is shown in FIG. 9. A schematic section thereof is shown in FIG. 10. In FIGS. 9 and 10, the MCP according to the present embodiment includes the two nonvolatile memories shown in FIGS. 7 and 8, and a controller including a CPU (Central Processing Unit) and a buffer memory, which are configured on a mounting substrate in the form of a layered structure. In the present embodiment, a spacer is provided between the two memory chips to laminate the two memory chips as described above. The spacer plays a role for ensuring space for disposing bonding wires (Au wires) of the memory chip provided on the lower side. At this time, a die bond film provided on the back surface side of the memory chip on the upper layer side can be used even for maintaining electrical insulating properties even if the bonding wires provided in the memory chip on the lower-layer side make contact with the back surface of the memory chip on the upper layer side. Even where the memory chip on the upper layer side is adhered to the spacer using the thermosetting adhesive, the electrical insulating properties are maintained by applying the thermosetting adhesive onto the full back surface of the memory chip on the upper layer side.

Figure 11:
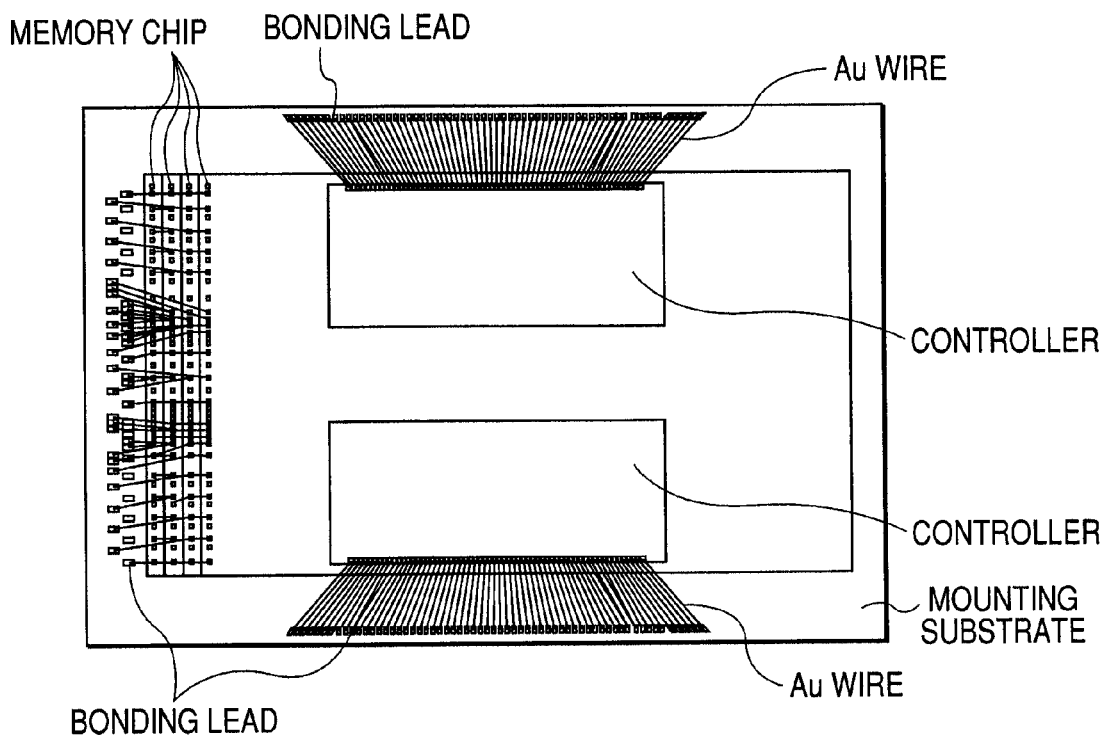
FIG. 11 is a plan view depicting a still further embodiment of a nonvolatile memory device according to the present invention.
Figure 12:
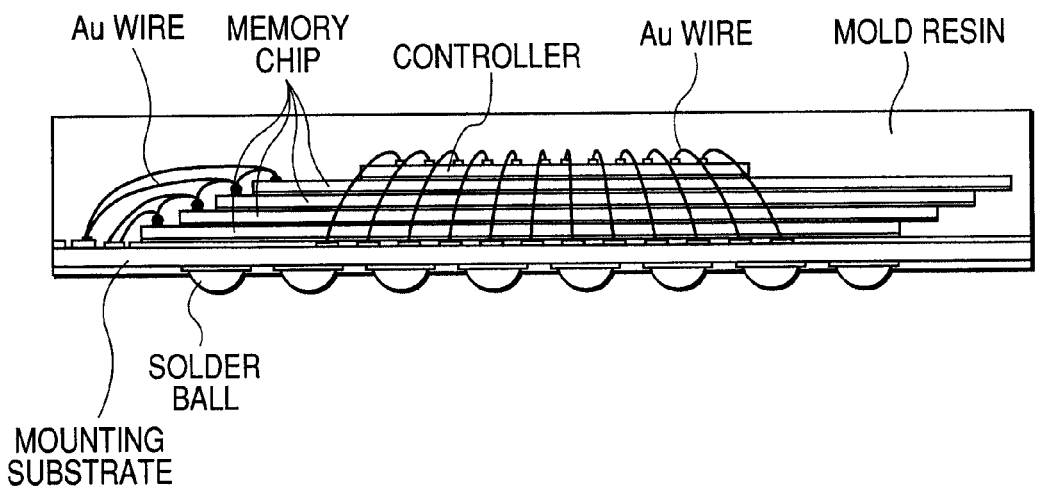
FIG. 12 is a schematic section of the nonvolatile memory device shown in FIG. 11.

A plan view depicting a still further embodiment of an MCP (SiP) illustrated as a nonvolatile memory device according to the present invention is shown in FIG. 11. A schematic section thereof is shown in FIG. 12. In FIGS. 11 and 12, the MCP according to the present embodiment includes, although not restricted in particular, four flash type nonvolatile memories each having a large storage capacity like an AG-AND type, and two controllers each including a CPU (Central Processing Unit) and a buffer memory, which are configured on a mounting substrate in the form of a layered structure. In this case, a storage capacity is set to twice that of one shown in FIGS. 1 and 2. That is, the 16G-bit nonvolatile memory device can be realized by combining the two sets of memory chips and the controller shown in FIG. 1.

The two controllers are mounted in such a manner that their bonding pad rows are disposed along upper and lower sides of the memory chips respectively. In this configuration, two nonvolatile memory devices are configured so as to exist on a system where the same controllers as ones shown in FIG. 1 and the like are used. That is, device-selecting terminals are provided in two pairs like the chip enable terminal CEB or the like. In contrast, a power supply terminal and data DQ (0-15) are connected in common. As to those that may be connected in common with one another between the same and the controllers in association with the formation of the memory chips in a four-layer structure, the bonding pad rows of the lower memory chips are set so as to have roles as relay electrodes and sequentially connected by Au wires. Those that need to be connected to the controllers independently are connected to their corresponding bonding leads.

While the invention made above by the present inventors has been described specifically on the basis of the preferred embodiments, the present invention is not limited to the embodiments referred to above. It is needless to say that various changes can be made thereto within the scope not departing from the gist thereof. It is not necessary to mount all of such plural functions as described above as the functions to be mounted to each controller, for example. In reverse, the controller may be one to which a new function is added in addition to the above functions. As the number of terminals corresponding to the interface S-IF which performs connection to the system side, and its function, various embodiments can be adopted. The memory chip may be set so as to have a plurality of bump electrodes face-to-face attachable to the mounting substrate in addition to ones electrically connected to a mounting substrate by wire bonding. The present invention can be widely used as a nonvolatile memory device of an MCP or SiP structure.

What is claimed is:

1. A semiconductor device comprising:
(a) a substrate having a front surface, a plurality of electrodes formed on the front surface, and a rear surface opposed to the front surface,
wherein the plurality of electrodes include a plurality of first electrodes and a plurality of second electrodes;
(b) a memory chip having a first main surface, a plurality of first bonding pads formed on the first main surface, and a first back surface opposed to the first main surface,
wherein the first main surface has a pair of first sides mutually opposed and a pair of second sides mutually opposed and intersecting with the first sides,
wherein the plurality of first bonding pads are arranged along one of the first sides, and not arranged along either of the second sides, and
wherein the memory chip is mounted over the front surface of the substrate such that the first back surface of the memory chip opposes the front surface of the substrate;
(c) a control chip having a second main surface, a plurality of second bonding pads formed on the second main surface, and a second back surface opposed to the second main surface,
wherein the second main surface has a pair of third sides mutually opposed and a pair of fourth sides mutually opposed and intersecting with the third sides,
wherein the plurality of second bonding pads are arranged along one of the fourth sides, and not arranged along either of the third sides and the other of the fourth sides,
wherein a size of the control chip is smaller than that of the memory chip in a plan view,
wherein the control chip is mounted over the first main surface of the memory chip such that the one of the fourth sides of the control chip is arranged next to one of the second sides of the memory chip, and
wherein the control chip is mounted over the first main surface of the memory chip such that a distance between the one of the fourth sides of the control chip and the one of the second sides of the memory chip is smaller than a distance between the other of the fourth sides of the control chip and the other of the second sides of the memory chip;
(d) a plurality of first wires coupling the plurality of first bonding pads with the plurality of first electrodes;
(e) a plurality of second wires coupling the plurality of second bonding pads with the plurality of second electrodes;
(f) a sealing body sealing the memory chip, the control chip, a plurality of first wires and a plurality of second wires; and
(g) a plurality of external terminals formed on the rear surface of the substrate,
wherein the plurality of first electrodes are arranged along the one of the first sides; and
wherein the plurality of second electrodes are arranged along one of the second sides of the memory chip.

2. The semiconductor device according to claim 1, wherein the control chip is mounted over the first main surface of the memory chip such that the one of the fourth sides is arranged next to the one of the second sides or the other of the second sides in a plan view.

3. The semiconductor device according to claim 2, wherein a planar shape of the memory chip is a rectangle.

4. The semiconductor device according to claim 2, wherein the plurality of first bonding pads are arranged along each of the first sides.

5. The semiconductor device according to claim 1, wherein another memory chip having a pair of fifth sides, a plurality of third bonding pads arranged along one of the fifth sides, and a pair of sixth sides intersecting with the fifth side is mounted over the front surface of the substrate, wherein the memory chip is mounted over the another memory chip such that the one of the first sides is arranged next to the one of the fifth sides, and such that the plurality of third bonding pads are exposed from the memory chip, and wherein the plurality of third bonding pads are coupled with the plurality of first electrodes via a plurality of third wires.

6. The semiconductor device according to claim 1, wherein the memory chip is mounted over the front surface of the substrate via a first thermosetting adhesive or a first die-bonding film, and wherein the control chip is mounted over the first main surface of the memory chip via a second thermosetting adhesive or a second die-bonding film.

7. The semiconductor device according to claim 1, wherein the memory chip has a memory portion comprised of a control gate and a floating gate, and wherein the control chip has a control portion formed by CMOS.

8. A semiconductor device comprising:

(a) a substrate having a front surface, a plurality of electrodes formed on the front surface, and a rear surface opposed to the front surface, wherein the plurality of electrodes include a plurality of first electrodes and a plurality of second electrodes;

(b) a memory chip having a first main surface, a plurality of first bonding pads formed on the first main surface, a first back surface opposed to the first main surface, wherein the first main surface has a pair of first sides and a pair of second sides intersecting with the first sides, wherein the plurality of first bonding pads are arranged along one of the first sides, and not arranged along either of the second sides and the other of the first sides, and wherein the memory chip is mounted over the front surface of the substrate such that the first back surface of the memory chip opposes the front surface of the substrate;

(c) a control chip having a second main surface, a plurality of second bonding pads formed on the second main surface, a second back surface opposed to the second main surface, wherein the second main surface has a pair of third sides and a pair of fourth sides intersecting with the third sides, wherein the plurality of second bonding pads are arranged along one of the fourth sides, and are not arranged along either of the third sides and the other of the fourth sides wherein a size in a plain view of the control chip is smaller than that of the memory chip, wherein the control chip is mounted over the first main surface of the memory chip such that the one of the fourth sides is arranged next to the other of the first sides, or one of the pair of second sides of the memory chip, and wherein the control chip is mounted over the first main surface of the memory chip such that a distance between the one of the fourth sides of the control chip and the side of the memory chip arranged next to the one of the fourth sides of the control chip is smaller than a distance between the other of the fourth sides of the control chip and the side of the memory chip arranged next to the other of the fourth sides of the control chip;

(d) a plurality of first wires coupling the plurality of first bonding pads with the plurality of first electrodes;

(e) a plurality of second wires coupling the plurality of second bonding pads with the plurality of second electrodes;

(f) a sealing body sealing the memory chip, the control chip, a plurality of first wires and a plurality of second wires;

(g) a plurality of external terminals formed on the rear surface of the substrate, wherein the plurality of first electrodes are arranged along the one of the first sides; and wherein the plurality of second electrodes are arranged along the side of the memory chip arranged next to the one of the fourth sides of the control chip.

* * * * *